(12) United States Patent
Narita et al.

(10) Patent No.: US 6,368,977 B1
(45) Date of Patent: Apr. 9, 2002

(54) SEMICONDUCTOR DEVICE MANUFACTURING METHOD

(75) Inventors: Masaki Narita; Yukimasa Yoshida; Katsuaki Aoki; Hiroshi Fujita; Takashi O, all of Yokohama; Toshimitsu Omine, Tokyo; Isao Matsui, Tokorozawa; Osamu Yamazaki, Yokohama; Naruhiko Kaji, Kamakura, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/605,436

(22) Filed: Jun. 29, 2000

(30) Foreign Application Priority Data

Jun. 30, 1999 (JP) .......................................... 11-186824

(51) Int. Cl.[7] .............................................. H01L 21/00
(52) U.S. Cl. ......................... 438/714; 216/37; 216/77; 438/720; 438/742
(58) Field of Search .................... 438/710, 712, 438/714, 720, 738, 742; 216/37, 67, 77

(56) References Cited

U.S. PATENT DOCUMENTS 5,296,094 A * 3/1994 Shan et al. .................. 438/714

FOREIGN PATENT DOCUMENTS

JP 03-44472 2/1991

* cited by examiner

Primary Examiner—William A. Powell
(74) Attorney, Agent, or Firm—Finnegan, Henderson, Farabow, Garrett & Dunner, L.L.P.

(57) ABSTRACT

There is provided a semiconductor device manufacturing method that comprises a first step of loading a processed substrate in a reaction chamber, a second step of introducing a reaction gas into the reaction chamber at a predetermined flow rate, a third step of maintaining an interior of the reaction chamber at a predetermined pressure, a fourth step of starting generation of plasma by supplying a high frequency power to an electrode arranged in the reaction chamber, a fifth step of applying a predetermined process to the processed substrate, and a sixth step of stopping generation of the plasma by stopping supply of the high frequency power after the predetermined process is completed, wherein the reaction gas is introduced continuously when the generation of the plasma is stopped.

7 Claims, 8 Drawing Sheets

FIG.4A
|  | 1 | 2 | 3 |
|---|---|---|---|
| GAS FLOW RATE | 0 | 100 | 100 |
| HF POWER | 0 | 0 | 1000 |
FIG.4B
|  | 1 | 2 | 3 |  |  | n |
|---|---|---|---|---|---|---|
| GAS FLOW RATE | 0 | 10 | 20 | ------- | 100 | 100 |
| HF POWER | 0 | 0 | 0 | ------- | 0 | 1000 |
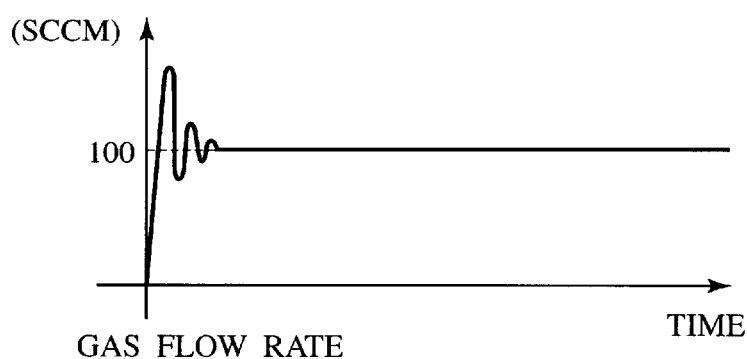
FIG.5A
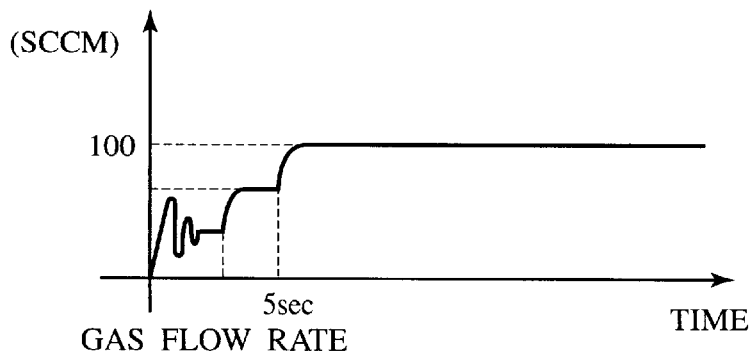
FIG.5B

FIG.9

|  | NUMBER OF DEFECT | SHORT-CIRCUIT TEST RESULT (YIELD) |
|---|---|---|
| CONVENTIONAL SEQUENCE | 36 | 81% |
| FIRST SEQUENCE | 18 | 90% |
| SECOND SEQUENCE | 7 | 97% |
| THIRD SEQUENCE | 16 | 92% |
| FOURTH SEQUENCE | 14 | 94% |

SEMICONDUCTOR DEVICE MANUFACTURING METHOD

BACKGROUND OF THE INVENTION

1. Field of the Invention

The present invention relates to a semiconductor device manufacturing method and, more particularly, a semiconductor device plasma processing method. Also, the present invention relates to a gas introducing method of capable of preventing the falling of particles onto a wafer before and after a plasma process.

2. Description of the Related Art

Such a substrate processing method is widely employed in the current semiconductor manufacturing steps that a processed substrate such as a wafer is placed in a reaction chamber, then plasma is generated by introducing a reaction gas and then applying a high frequency power to an electrode, a coil, or the like, and then a film is deposited on the processed substrate, a film deposited on the processed substrate is etched, and so forth. For example, according to a plasma CVD (Chemical Vapor Deposition) method, since the reaction gas introduced in the reaction chamber is activated by the plasma, a desired film can be formed on a surface of the processed substrate. Also, according to a dry etching method such as a CDE (Chemical Dry Etching) method, since the reaction gas activated by the plasma is coupled with film material which is subjected to the etching, reaction product having a high vapor pressure can be formed.

In these substrate processing methods using the plasma, the process of the substrate is not proceeded until the reaction gas is introduced into the low pressure reaction chamber and then the plasma is generated to activate the reaction gas. In other words, introduction of the reaction gas, control of a gas flow rate and a pressure in the reaction chamber up to desired values, and stable generation of the plasma are needed to execute the desired substrate process. Also, if generation of the plasma is stopped by stopping the application of the high frequency power, the process of the substrate is stopped. Therefore, normally the introduction of the reaction gas is stopped at the same time when application of the high frequency power is stopped. According to circumstances, in some cases, after the desired substrate process by the plasma is finished, the high frequency power that is applied to the electrode arranged in the reaction chamber is reduced once, then supply of the direct current voltage supplied to an electrostatic chuck is stopped, and then application of the high frequency power is stopped. In this case, the introduction of the reaction gas is also stopped at the same time when application of the high frequency power is stopped. In addition, in order to control the flow rate of the reaction gas introduced into the reaction chamber and the pressure in the reaction chamber during the process of the substrate, a mass flow controller is connected to gas introducing ports and also a variable valve whose opening can be adjusted is arranged between the reaction chamber and the vacuum pump.

However, the mass flow controller needs a minute time until it can operate stably immediately after the introduction of the reaction gas is started, and thus an increasing rate of the gas flow rate cannot be controlled during this time period. Therefore, a large amount of reaction gas exceeding the predetermined flow rate is introduced abruptly into the reaction chamber immediately after the introduction of the reaction gas is started. Also, under the pressure in the reaction chamber in which the substrate process is performed, behaviors of the particles existing in the reaction chamber is affected mostly by the flow of the reaction gas. Therefore, since the flow rate and the flow speed of the gas are changed abruptly if a large quantity of reaction gas is introduced suddenly, in some cases the particles existing in the reaction chamber are blown up and then fallen down on the processed substrate. In addition, normally the variable valve starts to operate together with the start of the gas introduction. Since the variable valve operates so as to restore the increase in pressure by the suddenly introduced reaction gas into the predetermined pressure in a short time, controllability of the variable valve becomes worse immediately after the introduction of the reaction gas is started. Accordingly, since the flow rate, the flow speed, and the pressure are changed irregularly in the reaction chamber immediately after the introduction of the reaction gas is started, there is a possibility that the particles existing in the reaction chamber are blown up and then fallen down on the processed substrate. If the substrate process is performed in the situation that the particles are still present on the processed substrate, abnormality of shapes of the film to be deposited or abnormality of shapes of the film to be etched is caused, and thus it is difficult to manufacture the semiconductor device with good yield.

Moreover, based on various experiments, it can be understood that, while the generation of the plasma is being maintained, the particles are charged into the minus and repelled by the sheath as the negative potential area, so that such particles are floating over the sheath and seldom fallen down on the substrate. However, when the sheath disappears by stopping the generation of the plasma, the particles lose a repulsion force against the sheath and thus they are fallen down onto the wafer. It is needless to say that, if the succeeding processes are performed while the particles still exist on the processed substrate as they are, such particles are not preferable for the semiconductor manufacturing steps.

SUMMARY OF THE INVENTION

The present invention has been made to overcome such problems, and it is an object of the present invention to provide a semiconductor device manufacturing method capable of reducing the particles that fall down onto a processed wafer before and after a plasma process to thus reduce generation of abnormality of shapes due to the particles.

It is another object of the present invention to provide a semiconductor device manufacturing method capable of achieving high production yield.

In order to achieve the above object, according to a first aspect of the present invention, there is provided a semiconductor device manufacturing method which comprises at least a first step of loading a processed substrate in a reaction chamber; a second step of introducing a reaction gas into the reaction chamber at a predetermined flow rate; a third step of maintaining an interior of the reaction chamber at a predetermined pressure; a fourth step of starting generation of plasma by supplying a high frequency power to an electrode arranged in the reaction chamber; a fifth step of applying a predetermined process to the processed substrate; and a sixth step of stopping generation of the plasma by stopping supply of the high frequency power while introducing continuously a gas at the predetermined flow rate after the predetermined process is completed. Here, the "predetermined process" are a process of depositing a film on the processed substrate, a process of etching the film deposited on the processed substrate, etc. The "predetermined flow rate" is a flow rate at which the predetermined process can be performed by generating the plasma. The "predetermined pressure" is a pressure in the reaction chamber, by which the predetermined process can be performed by generating the plasma.

According to the first aspect of the present invention, since the gas is still introduced continuously at the predetermined flow rate when the generation of the plasma is stopped, the particles that are floating over the sheath can be exhausted together with the gas introduced continuously, to prevent their falling onto the wafer.

In the first aspect of the present invention, in the sixth step, preferably the flow rate of the gas introduced continuously is larger than the predetermined flow rate. By introducing continuously the gas larger than the predetermined flow rate, the particles being floating over the sheath can be exhausted more effectively to together with the introduced gas without falling on the processed substrate.

Also, in the sixth step, preferably a pressure in the reaction chamber is lower than the predetermined pressure. By introducing continuously the gas at the predetermined flow rate and setting the pressure in the reaction chamber low, the particles being floating over the sheath can be exhausted more effectively to together with the introduced gas without falling on the processed substrate.

According to a second aspect of the present invention, there is provided a semiconductor device manufacturing method which comprises at least a first step of loading a processed substrate in a reaction chamber; a second step of introducing a reaction gas into the reaction chamber at a predetermined flow rate, by increasing a flow rate at a speed of less than 50 sccm/second; a third step of maintaining an interior of the reaction chamber at a predetermined pressure; a fourth step of starting generation of plasma by supplying a high frequency power to an electrode arranged in the reaction chamber; a fifth step of applying a predetermined process to the processed substrate; and a sixth step of stopping generation of the plasma by stopping supply of the high frequency power after the predetermined process is completed. Here, in the second step, the reaction gas is not abruptly introduced at the predetermined flow rate, but the flow rate of the introduced reaction gas is increased up to the predetermined flow rate by increasing at a rate of 50 sccm/second.

According to the second aspect of the present invention, the case where the gas that is in excess of the predetermined flow rate is abruptly introduced can be eliminated until the mass flow controller is operated stably immediately after the start of the gas introduction. Accordingly, it is possible to prevent the situation that the particles adhered onto an inner wall of the reaction chamber, etc. are whirled up and then fallen down onto the wafer. In particular, it is possible to prevent the event that reaction products adhered onto inner walls of gas pipes of gas introducing ports are peeled off and then fall down onto the wafer as the particles.

According to a third aspect of the present invention, there is provided a semiconductor device manufacturing method which comprises at least a first step of loading a processed substrate in a reaction chamber; a second step of introducing a reaction gas into the reaction chamber at a predetermined flow rate; a third step of maintaining an interior of the reaction chamber at a predetermined pressure; a fourth step of starting generation of plasma by supplying a high frequency power to an electrode arranged in the reaction chamber; a fifth step of applying a predetermined process to the processed substrate; and a sixth step of stopping generation of the plasma by stopping supply of the high frequency power after the predetermined process is completed; wherein a pressure in the reaction chamber is set lower than the predetermined pressure before introduction of the reaction gas into the reaction chamber is started.

According to the third aspect of the present invention, even when the particles are blown up in the reaction chamber since the reaction gas is abruptly introduced to exceed the predetermined flow rate until the reaction gas is introduced at the predetermined flow rate immediately after the gas introduction is started, the pressure in the reaction chamber is held low. Therefore, such particles can be exhausted together with the introduced gas.

According to a fourth aspect of the present invention, there is provided a semiconductor device manufacturing method which comprises at least a first step of loading a processed substrate in a reaction chamber; a second step of introducing a reaction gas into the reaction chamber at a predetermined flow rate; a third step of maintaining an interior of the reaction chamber at a predetermined pressure; a fourth step of starting generation of plasma by supplying a high frequency power to an electrode arranged in the reaction chamber; a fifth step of applying a predetermined process to the processed substrate; and a sixth step of stopping generation of the plasma by stopping supply of the high frequency power after the predetermined process is completed; wherein, in the fourth step, a flow of a gas which is in parallel with the processed substrate and is directed to an exhausting means side is formed on the processed substrate. Here, the "exhausting means" is a means for reducing the pressure in the reaction chamber to the predetermined pressure, and corresponds to a vacuum pump connected to the reaction chamber, etc. Also, the "exhausting means side" corresponds to a side of the reaction chamber, to which the vacuum pump is connected.

According to the fourth aspect of the present invention, before the predetermined process is applied to the processed substrate, the particles dropped on the processed substrate can be blown away by flowing the gas on the processed substrate in parallel with the processed substrate, and be removed.

According to a fifth aspect of the present invention, there is provided a semiconductor device manufacturing method which comprises at least a first step of loading a processed substrate in a reaction chamber; a second step of introducing a reaction gas into the reaction chamber at a predetermined flow rate; a third step of maintaining an interior of the reaction chamber at a predetermined pressure; a fourth step of starting generation of plasma by supplying a high frequency power to an electrode arranged in the reaction chamber; a fifth step of applying a predetermined process to the processed substrate; and a sixth step of stopping generation of the plasma by stopping supply of the high frequency power after the predetermined process is completed; wherein, in the sixth step, a flow of a gas which is in parallel with the processed substrate and is directed to an exhausting means side is formed on the processed substrate.

According to the fifth aspect of the present invention, since the gas is flown onto the processed substrate in parallel with the processed substrate when the generation of the plasma is stopped, the particles floating over the sheath can be removed to be carried on the gas flow without falling down on the processed substrate.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 4A is a table showing change in a set flow rate of a mass flow controller with the lapsed of time in the sequence in the prior art;

FIG. 4B is a table showing change in a set flow rate of a mass flow controller with the lapsed of time in the fourth sequence;

FIG. 5A is a graph showing change in a flow rate of a reaction gas upon starting the gas introduction with the lapsed of time in the sequence in the prior art;

FIG. 5B is a graph showing change in a flow rate of a reaction gas upon starting the gas introduction with the lapsed of time in the fourth sequence;

FIG. 9 is a table the number of defect and yield formed on a substrate that is processed in compliance with the first to fourth sequences and the sequence in the prior art;

DETAILED DESCRIPTION OF THE PREFERRED EMBODIMENTS

Figure 1:
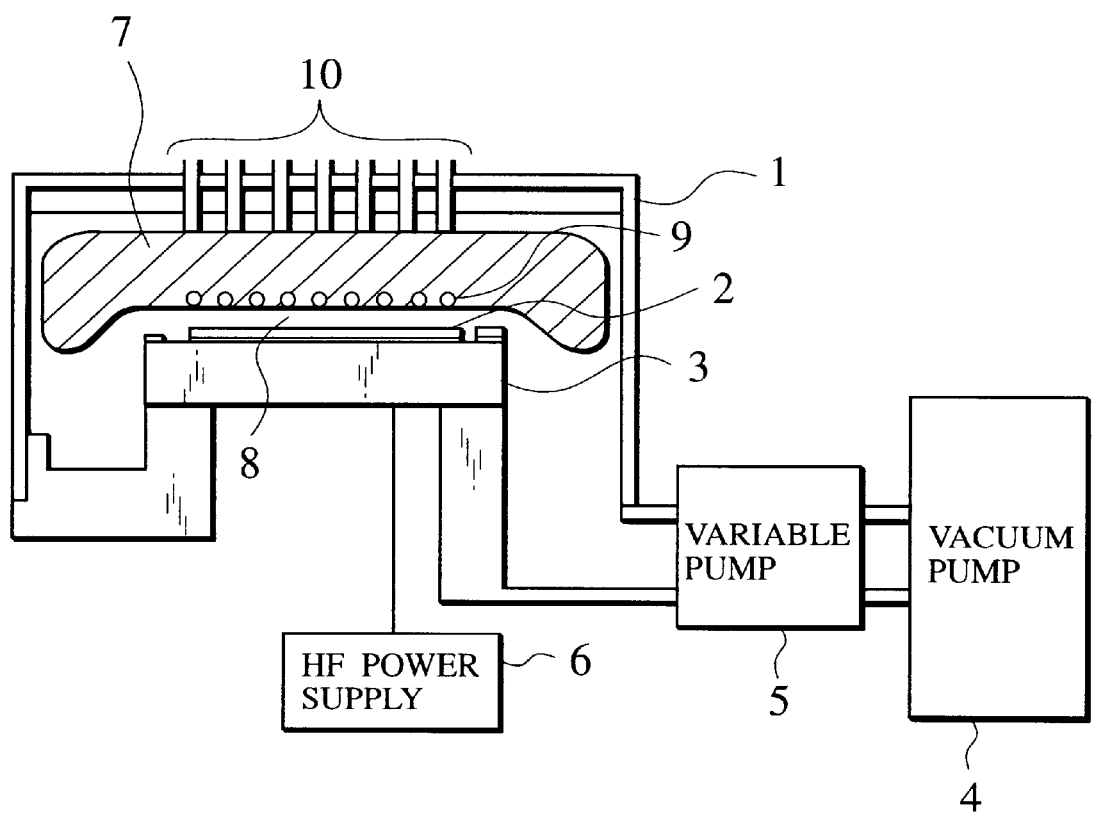
FIG. 1 is a sectional view showing a configuration of a plasma processing equipment according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor interior a given figure, and in particular that the layer thicknesses are arbitrarily drawn for facilitating the reading of the drawings.

(Behaviors of Particles)

Prior to explanation of embodiments of the present invention, experiments performed by the inventors about to behaviors of particles in a reaction chamber will be explained hereunder. In order to check the influence of introduction of a reaction gas into the reaction chamber upon behaviors of particles in the reaction chamber, the inventors of the present invention have carried out the experiment described in the following, by using a dry etching equipment shown in FIG. 10A and FIG. 10B.

Figure 10A:
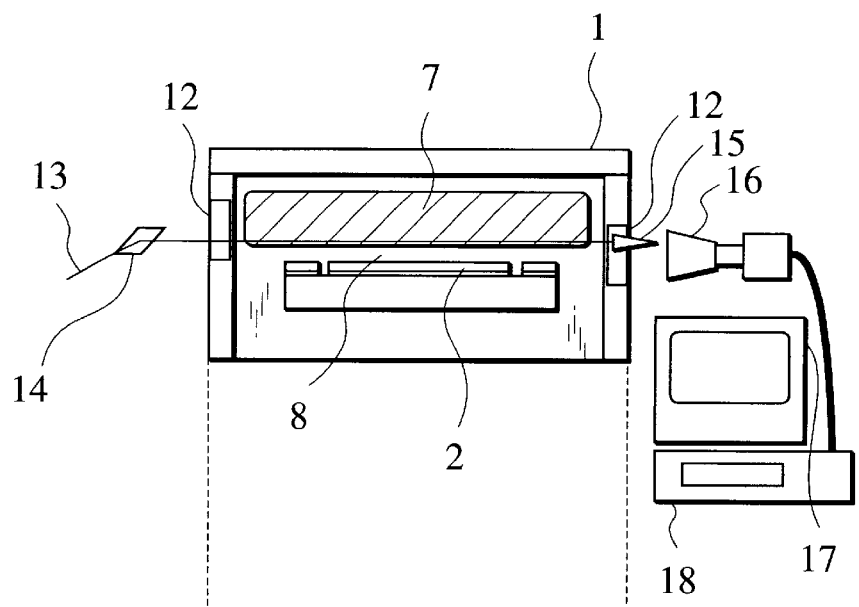
FIG. 10A is a sectional view showing a configuration of the plasma processing equipment in connection with behaviors of particles.
Figure 10B:
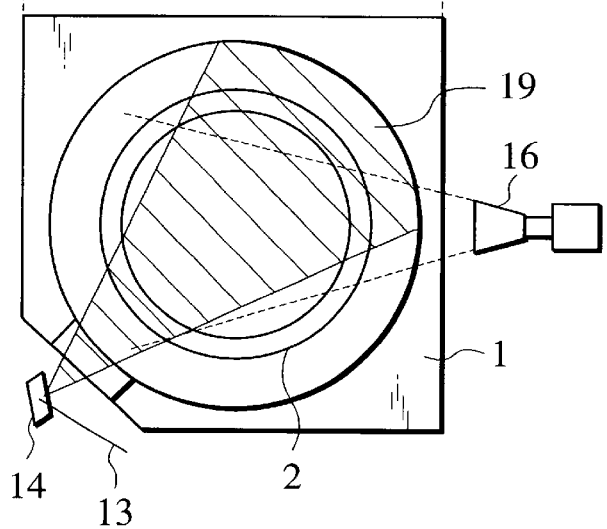
FIG. 10B is a plan view showing the configuration of the plasma processing equipment in connection with behaviors of particles.

FIG. 10A shows a sectional view of the dry etching equipment, and FIG. 10B shows a plan view of the same. As shown in FIG. 10A, the dry etching equipment comprises a reaction chamber 1; windows 12 arranged on a side wall of the reaction chamber 1 to watch the behaviors of particles; a laser beam 13 irradiated into the reaction chamber 1 via the windows 12; a CCD camera 16 for detecting a laser beam (scattered light) 15 scattered by the particles in the reaction chamber 1 via the windows 12; and a monitor 17 for displaying images of the CCD camera 16 and a video 18 for saving the images. The laser beam 13 is irradiated on a sheath 8 in parallel with a processed substrate (wafer) 2 and is scanned on the sheath 8 by a reflecting mirror 14 in parallel with the wafer 2. This is because the laser beam 13 is caused to be irradiated onto the particles floating over the sheath 8. The sheath 8 is formed between the wafer 2 arranged in the reaction chamber 1 and a plasma 7 generated in the reaction chamber 1. Also, as shown in FIG. 10B, since the laser beam 13 can be scanned on the most area of the wafer 2 in the reaction chamber 1, a range in which the CCD camera 16 can detect the particles can be expanded. A hatched portion in FIG. 10B indicates a scanning area 19 of the laser beam. In this case, the plasma processing equipment shown in FIG. 10A and FIG. 10B is the magnetron RIE equipment, and quartz windows are employed as the windows 12.

By using such dry etching equipment, behaviors of the particles in the reaction gas introducing sequence performed in the prior art (referred to as a "sequence in the prior art" hereinafter) are watched by virtue of the scattered light 15.

(1) First, the wafer 2 is carried from a load lock chamber into the reaction chamber 1 of the plasma processing equipment, and then loaded on a cathode electrode. Then, a reaction gas is introduced into the reaction chamber 1. A set flow rate of the reaction gas is 100 sccm and a set pressure in the reaction chamber 1 is 40 mTorr. In order to control a flow rate of the reaction gas, a mass flow controller is employed. A set flow rate of the mass flow controller is a gas flow rate that is introduced in processing the wafer. It has been watched that the value of the flow rate of the reaction gas, which is indicated by the mass flow controller, is increased instantly at a moment when introduction of the reaction gas is started, and at the same time several particles fall down onto the wafer 2. Also, a pressure controlling variable valve operates to maintain an interior of the reaction chamber 1 at a predetermined pressure in response to the immediate increase of the gas flow rate. It has been watched that the particles also fall down onto the wafer 2 every time when a closing motion of the variable valve occurs.

(2) Then, after the reaction gas is introduced into the reaction chamber 1 at a predetermined flow rate and then the interior of the reaction chamber 1 comes up to a predetermined pressure, the plasma is generated by applying a high frequency voltage of 13.56 Mz to the cathode electrode on which the wafer 2 is loaded. It has been watched that the particles are floating over the sheath 8 formed between the wafer 2 and the plasma 7. It may be considered that, since the particles existing in the plasma are charged into the minus polarity, the sheath 8 having a negative potential gradient repel the particles.

(3) Then, after the predetermined wafer process is finished, generation of the plasma is terminated by stopping application of the high frequency power supplied to the cathode electrode, and at the same time the introduction of the reaction gas is stopped. Since the generation of the plasma is terminated, the sheath 8 formed between the wafer 2 and the plasma 7 also disappears. It has been watched that, when the sheath 8 disappears, the particles also fall down onto the wafer 2. It seems that, due to disappearance of the sheath 8, the particles floating over the sheath 8 lose a repulsion force against the sheath 8 and thus they fall down onto the wafer 2.

Next, behaviors of the particles are watched after the sequence of the reaction gas and the pressure sequence in the reaction chamber are changed.

(1) First, until the flow rate of the reaction gas reaches a predetermined flow rate of 100 sccm after the introduction of the reaction gas is started, the reaction gas is introduced while increasing the flow rate gradually. About five seconds has elapsed to reach 100 sccm. At that time, such a phenomenon has not been watched that the particles fall down onto the wafer 2 upon introduction of the gas, as seen immediately after the introduction of the reaction gas is started in the sequence in the prior art. Also, after the gas flow rate reaches the predetermined flow rate, the pressure controlling variable valve is operated such that the interior of the reaction chamber 1 is kept at the predetermined pressure. When the closing operation of the variable valve is executed, neither an overshoot phenomenon of the variable valve nor the falling of the particles appears.

(2) Then, after the predetermined flow rate and the predetermined pressure are attained, generation of the plasma 7 is started by applying the high frequency power of 13.56 MHz to the cathode electrode. It has been watched that the sheath 8 is formed between the wafer 2 and the plasma 7 and also the particles are floating over the sheath 8.

(3) Then, after the predetermined wafer process is finished, the generation of the plasma 7 is stopped by stopping application of the high frequency power supplied to the cathode electrode, but the introduction of the reaction gas is not stopped and is continued as it is. As a result, most of the particles floating over the sheath 8 do not fall down onto the wafer 2, but are exhausted together with the reaction gas. Accordingly, it becomes apparent that, in the sequence in the prior art, a large amount of particles fall down onto the wafer 2 when the sheath 8 disappears, nevertheless most of the particles can be exhausted by keeping the introduction of the reaction gas. Also, if the pressure in the reaction chamber 1 is reduced lower than the predetermined pressure by increasing the flow rate of the reaction gas or increasing an opening of the pressure controlling variable valve when the generation of the plasma 7 is stopped by stopping the application of the high frequency power, the similar or superior effect can be achieved.

EMBODIMENTS

<First Sequence>

Embodiments of the present invention will be explained based on experimental results in connection with the behaviors of the above particles. FIG. 1 is a sectional view showing a configuration of a plasma processing equipment according to an embodiment of the present invention. The plasma processing equipment is a magnetron RIE equipment that comprises the reaction chamber 1 as a vacuum vessel; the variable valve 5 connected to the reaction chamber 1 to control the pressure in the reaction chamber 1; the vacuum pump 4 connected to the variable valve 5; the electrode (cathode electrode) 3 on which the wafer 2 is loaded; a plurality of gas introducing ports 10 arranged on the wafer 2 in a concentric circle; and a high frequency (HF) power supply 6 for supplying an high frequency (HF) power to the cathode electrode 3. The plasma 7 is generated by the HF power supplied from the HF power supply 6, and the sheath 8 is formed between the plasma 7 and the wafer 2, and the particles are floating over the sheath 8. In addition, although not shown, a mass flow controller that controls the flow rate of the reaction gas is connected to the gas introducing ports 10. The reaction gas is introduced into the reaction chamber 1 at the flow rate that is set by the mass flow controller. In addition, as plasma conditions for the wafer process, the pressure in the reaction chamber 1 is 40 mTorr, the HF power is 800 W, the reaction gas is $CF_4/O_2$, the gas flow rate is 100 sccm, and the etching time is 20 seconds.

Figure 2A:
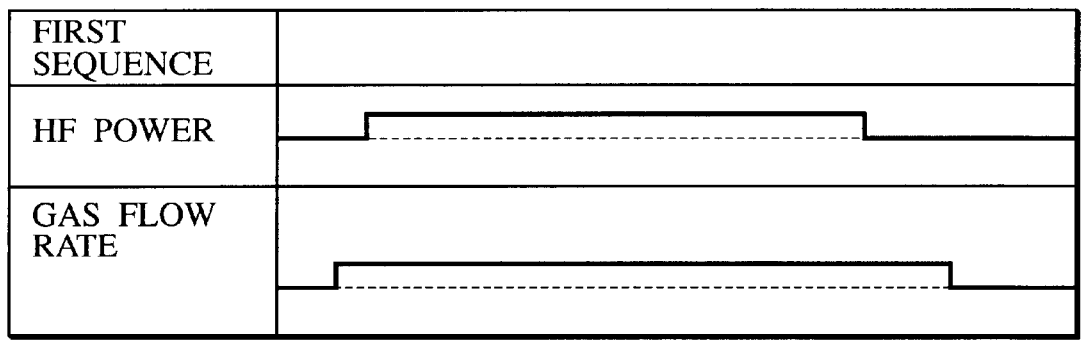
FIG. 2A shows a first sequence of gas introduction and a pressure in a reaction chamber according to the embodiment of the present invention.

FIG. 2A shows a first sequence according to the embodiment of the present invention. First, the wafer 2 is carried from a load lock chamber into the reaction chamber 1 and is loaded onto the cathode electrode 3. Then, the reaction gas is introduced into the reaction chamber 1 at the predetermined flow rate via the gas introducing ports 10. A set flow rate of the mass flow controller in starting the introduction of the reaction gas is 100 sccm, that is the predetermined flow rate for the wafer process. Then, the interior of the reaction chamber 1 is maintained at a predetermined pressure by adjusting the opening of the variable valve 5 serving as a pressure adjusting mechanism. Then, the generation of the plasma 7 is started by supplying the HF power to the cathode electrode 3 being arranged in the reaction chamber 1. Then, the predetermined wafer process is applied to the wafer 2 which is placed on the cathode electrode 3 in the reaction chamber 1. Then, after the predetermined wafer process is completed, supply of the HF power is stopped and also the generation of the plasma 7 in the reaction chamber 1 is stopped.

As shown in FIG. 2A, when the generation of the plasma 7 is stopped by stopping the supply of the HF power, the gas is continuously introduced at a predetermined flow rate. It is preferable that the reaction gas should be selected as the seed of the gas that is introduced continuously. However, different type gas such as an inert gas, etc. may be introduced. FIG. 3C shows the sequence in the prior art. As shown in FIG. 3C, in the prior art, the introduction of the gas is stopped at the same time when the generation of the plasma 7 is stopped.

According to the first sequence, since the gas is still introduced continuously at the predetermined flow rate when the generation of the plasma 7 is stopped, the particles 9 that are floating over the sheath 8 can be exhausted together with the gas introduced continuously, to prevent their falling onto the wafer 2.

<Second Sequence>

Figure 2B:
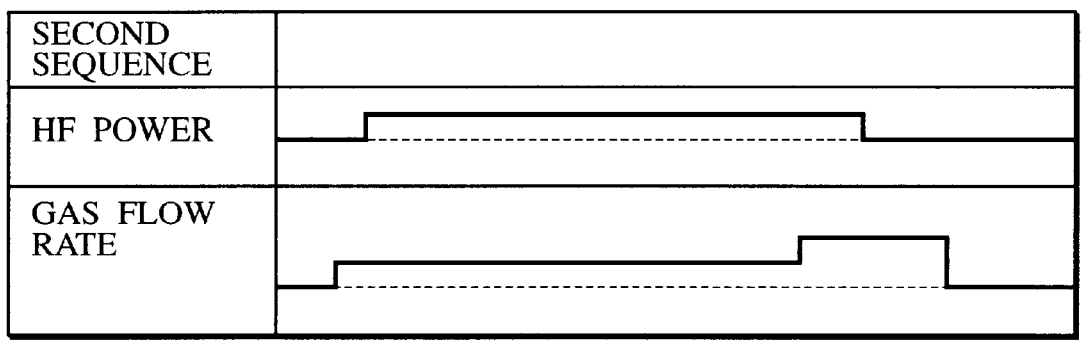
FIG. 2B shows a second sequence of gas introduction and a pressure in the reaction chamber according to the embodiment of the present invention.

FIG. 2B shows a second sequence according to the embodiment of the present invention. Like the first sequence, at first, the wafer 2 is carried from the load lock chamber into the reaction chamber 1 and is loaded onto the cathode electrode 3. Then, the reaction gas is introduced into the reaction chamber 1 at the predetermined flow rate via the gas introducing ports 10. The set flow rate of the mass flow controller in starting the introduction of the reaction gas is 100 sccm, that is the predetermined flow rate. Then, the interior of the reaction chamber 1 is maintained at the predetermined pressure by adjusting the opening of the variable valve 5 serving as a pressure adjusting mechanism. Then, the generation of the plasma 7 is started by supplying the HF power to the cathode electrode 3 that is arranged in the reaction chamber 1. Then, the predetermined wafer process is applied to the wafer 2 which is placed on the cathode electrode 3 in the reaction chamber 1. Then, after the predetermined wafer process is completed, supply of the HF power is stopped and also the generation of the plasma 7 in the reaction chamber 1 is stopped.

As shown in FIG. 2B, when the generation of the plasma 7 is stopped, the reaction gas is introduced continuously into the reaction chamber 1 at a flow rate in excess of the predetermined flow rate. A flow rate of overall introduced gas may be increased by introducing continuously the reaction gas at the predetermined flow rate and introducing additionally a gas such as the inert gas which has different type from the reaction gas only when the generation of the plasma 7 is stopped. In addition, it is desired that the flow rate of the gas, that is introduced via the gas introducing ports 10 arranged over the wafer 2, should be increased. However, a gas introducing means may be provided as a different system from the gas introducing ports 10, and then the gas may be introduced via the different system only when the generation of the plasma 7 is stopped.

According to the second sequence, if a total flow rate of the gas being introduced into the reaction chamber 1 is increased when the generation of the plasma 7 is stopped and thus the sheath 8 disappears, the particles 9 floating over the sheath 8 under the condition that the plasma 7 is being generated can be exhausted together with the introduced gas effectively rather than the case where the gas is introduced continuously according to the first sequence, not to drop onto the wafer 2.

<Third Sequence>

Figure 2C:
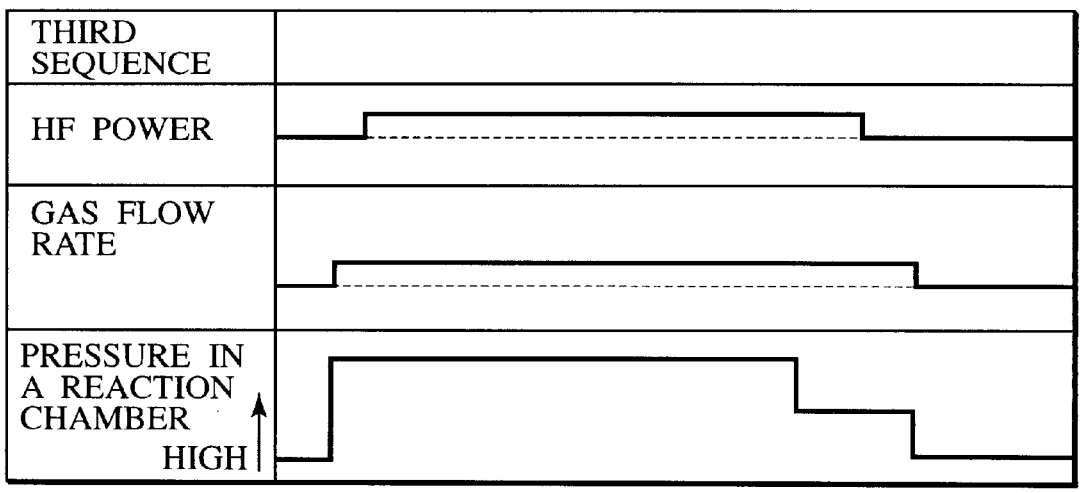
FIG. 2C shows a third sequence of gas introduction and a pressure in the reaction chamber according to the embodiment of the present invention.

FIG. 2C shows a third sequence according to the embodiment of the present invention. Like the first sequence, at first, the wafer 2 is carried from the load lock chamber into the reaction chamber 1, and is loaded onto the cathode electrode 3. Then, the reaction gas is introduced into the reaction chamber 1 at the predetermined flow rate via the gas introducing ports 10. The set flow rate of the mass flow controller in starting the introduction of the reaction gas is 100 sccm, that is the predetermined flow rate. Then, the interior of the reaction chamber 1 is maintained at the predetermined pressure by adjusting the opening of the variable valve 5 serving as a pressure adjusting mechanism. Then, the generation of the plasma 7 is started by supplying the HF power to the cathode electrode 3 that is arranged in the reaction chamber 1. Then, the predetermined wafer process is applied to the wafer 2 that is placed on the cathode electrode 3 in the reaction chamber 1. Then, after the predetermined wafer process is completed, the supply of the HF power is stopped and also the generation of the plasma 7 in the reaction chamber 1 is stopped.

As shown in FIG. 2C, like the first sequence, the gas is introduced continuously at the predetermined flow rate when the generation of the plasma 7 is stopped. Also, when the generation of the plasma 7 is stopped, the pressure in the reaction chamber 1 is set lower than the predetermined pressure by opening the pressure controlling variable valve 5 more largely. More particularly, before the generation of the plasma 7 is stopped, the pressure is set to 20 mTorr by opening the pressure controlling variable valve 5. After this, the generation of the plasma 7 is stopped by stopping the supply of the HF power applied to the cathode electrode 3.

According to the third sequence, the particles 9 are floating over the sheath 8 under the condition that the plasma 7 is being generated. Then, when the generation of the plasma 7 is stopped and thus the sheath 8 disappears, the particles 9 floating over the sheath 8 fall down onto the wafer 2. However, if the gas is introduced continuously at the predetermined flow rate and also the pressure in the reaction chamber 1 is lowered when the generation of the plasma 7 is stopped, the particles 9 floating over the sheath 8 can be exhausted more effectively in contrast to the first sequence without their falling onto the wafer 2.

<Fourth Sequence>

Figure 3A:
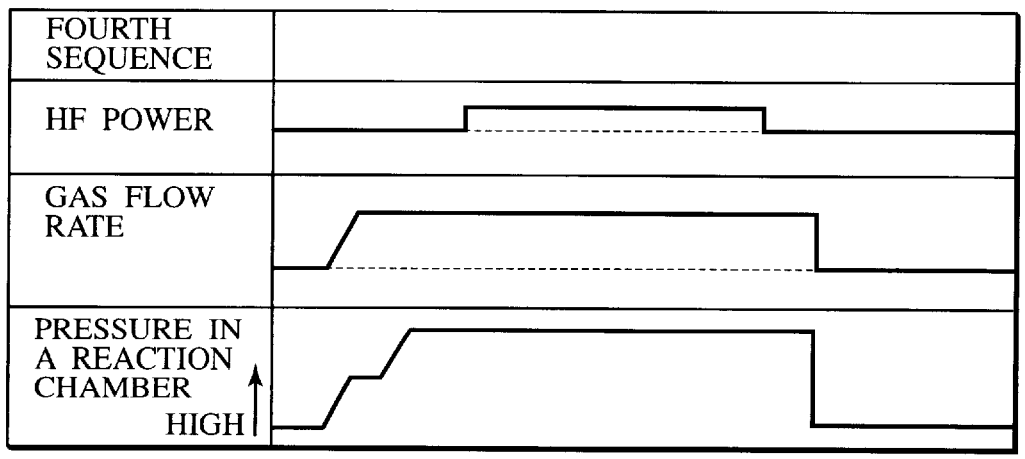
FIG. 3A shows a fourth sequence of gas introduction and a pressure in the reaction chamber according to the embodiment of the present invention.

FIG. 3A shows a fourth sequence according to the embodiment of the present invention. First, the wafer 2 is carried from the load lock chamber into the reaction chamber 1, and is loaded onto the cathode electrode 3. Then, the reaction gas is introduced into the reaction chamber 1 at the predetermined flow rate via the gas introducing ports 10.

Then, as shown in FIG. 3A, upon starting the introduction of the reaction gas, the flow rate of the reaction gas is increased gradually so as to reach the predetermined flow rate. FIG. 4B shows change in the set flow rate of the mass flow controller with the lapsed of time in the fourth sequence. More particularly, as shown in FIG. 4B, first the gas introduction is started by setting the set value of the mass flow controller to 10 sccm. Then, after the gas flow rate becomes stable at 10 sccm, the set flow rate is changed to 20 sccm. Then, the flow rate of the introduced gas is increased up to 100 sccm by increasing the set flow rate by 10 sccm for about five seconds after the start of the introduction. That is, the gas flow rate is increased at a flow rate increasing rate of 20 sccm/sec. FIG. 5B is a graph showing change in the flow rate of the reaction gas upon starting the gas introduction with the lapsed of time. The gas flow rate can reach the predetermined flow rate not to exceed the predetermined flow rate (100 sccm) required for the wafer process. FIG. 4A shows change in the set flow rate of the mass flow controller with the lapsed of time in the sequence in the prior art. FIG. 5A shows change in the flow rate of the reaction gas upon starting the gas introduction with the lapsed of time in the sequence in the prior art. It can be understood that, in case the predetermined flow rate required for the wafer process is set on the mass flow controller at the beginning of the gas introduction, a large amount of gas that is in excess of the predetermined flow rate flows suddenly immediately after the gas introduction is started.

Then, the interior of the reaction chamber 1 is maintained at the predetermined pressure by adjusting the opening of the variable valve 5 serving as a pressure adjusting mechanism. Then, the generation of the plasma 7 is started by supplying the HF power to the cathode electrode 3 that is arranged in the reaction chamber 1. Then, the predetermined wafer process is applied to the wafer 2 that is placed on the cathode electrode 3 in the reaction chamber 1. Then, after the predetermined wafer process is completed, the supply of the HF power is stopped and also the generation of the plasma 7 in the reaction chamber 1 is stopped. As shown in FIG. 3A, when the generation of the plasma 7 is stopped, the predetermined flow rate required for the wafer process is continuously introduced.

Figure 6:
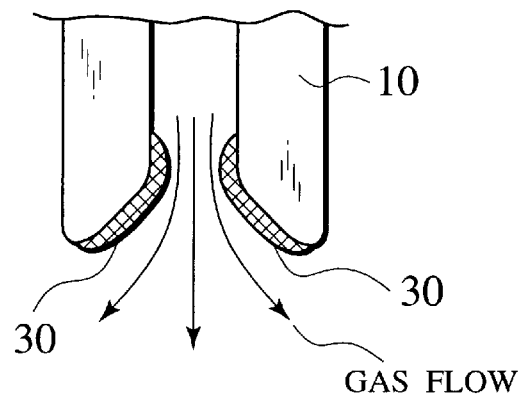
FIG. 6 is a view showing reaction product adhered onto inner walls at top portions of gas introducing ports.

According to the fourth sequence, the case where the gas that is in excess of the predetermined flow rate is abruptly introduced can be eliminated until the mass flow controller is operated stably immediately after the start of the gas introduction. Accordingly, it is possible to prevent the situation that the particles 9 adhered onto an inner wall of the reaction chamber 1, etc. are whirled up and then fallen down onto the wafer 2. In particular, as shown in FIG. 6, it is possible to prevent the event that reaction products 30 adhered onto inner walls of gas pipes of gas introducing ports 10 are peeled off and then fall down onto the wafer 2 as the particles 9.

<Fifth Sequence>

Figure 3B:
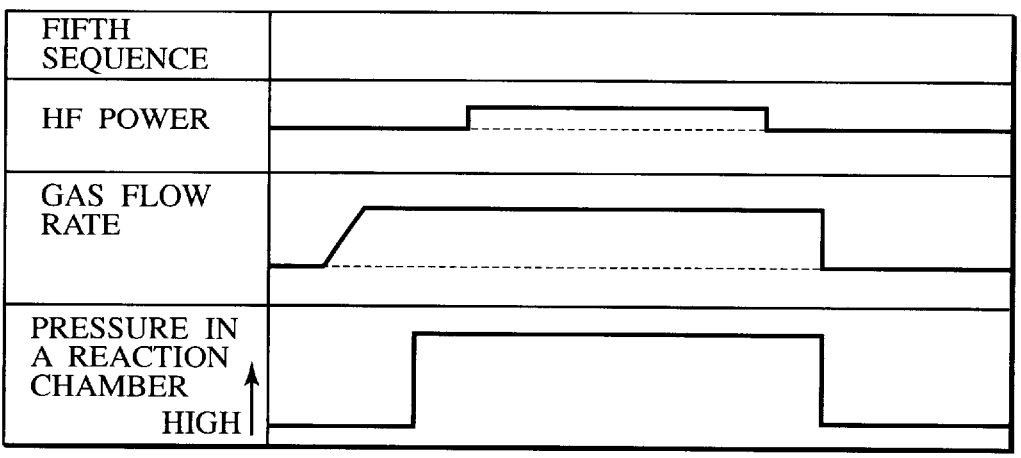
FIG. 3B shows a fifth sequence of gas introduction and a pressure in the reaction chamber according to the embodiment of the present invention.
Figure 3C:
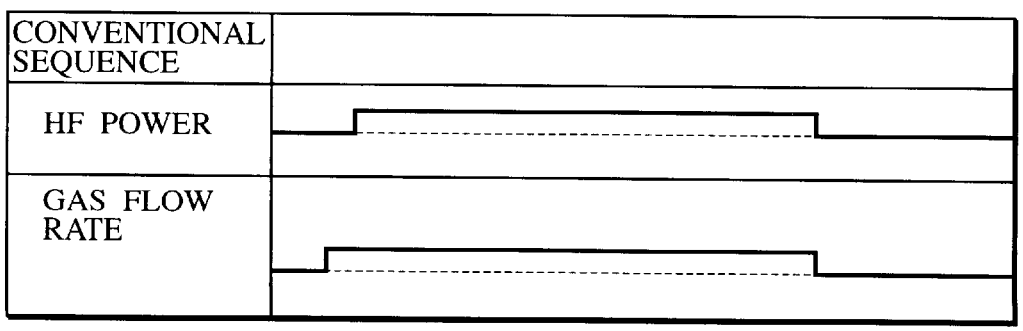
FIG. 3C shows a sequence of gas introduction and a pressure in the reaction chamber in the prior art.

FIG. 3B shows a fifth sequence according to the embodiment of the present invention. First, the wafer 2 is carried from a load lock chamber into the reaction chamber 1 and is loaded onto the cathode electrode 3. Then, the reaction gas is introduced into the reaction chamber 1 at the predetermined flow rate via the gas introducing ports 10.

As shown in FIG. 3B, upon starting the introduction of the reaction gas, the gas flow rate is increased gradually so as to reach the predetermined flow rate. Also, the introduction of the reaction gas is started, the pressure in the reaction chamber 1 is set lower than the predetermined pressure. More particularly, before the introduction of the reaction gas is started, the pressure in the reaction chamber 1 is set low by setting the set pressure lower than the predetermined pressure required for the wafer process and then opening the pressure controlling variable valve 5 more largely. Then, the variable valve 5 is operated such that this pressure can be still kept until the flow rate comes up to the predetermined flow rate required for the wafer process after the start of the gas introduction.

Then, the interior of the reaction chamber 1 is maintained at the predetermined pressure required for the wafer process by adjusting the opening of the variable valve 5 serving as the pressure adjusting mechanism. Then, the generation of the plasma 7 is started by supplying the HF power to the cathode electrode 3 arranged in the reaction chamber 1. Then, the predetermined wafer process is applied to the wafer 2 that is loaded on the cathode electrode 3 in the reaction chamber 1. Then, after the predetermined wafer process is completed, supply of the HF power is stopped and also the generation of the plasma 7 in the reaction chamber 1 is stopped. As shown in FIG. 3B, when the generation of the plasma 7 is stopped, the reaction gas is still introduced continuously at the predetermined flow rate.

According to the fifth sequence, since the reaction gas is still introduced continuously at the predetermined flow rate when the generation of the plasma is stopped, the particles 9 floating over the sheath 8 can be exhausted together with the continuously introduced gas without falling onto the wafer 2. Also, since the event that the gas is introduced abruptly at the flow rate exceeding the predetermined flow rate required for the wafer process immediately after the start of the gas introduction can be eliminated, it is possible to prevent the situation that the particles 9 adhered onto an inner wall of the reaction chamber 1, etc. are blown up and then fallen down onto the wafer 2. In addition, since the pressure in the reaction chamber 1 is held low even if the particles are blown up by the flow of the gas immediately after the gas introduction is started, such particles can be exhausted by the introduced gas. Further, if the pressure is set as low as possible upon starting the gas introduction, the effect for preventing the falling of the particles can be enhanced much more.

<Sixth Sequence>

In a sixth sequence according to the embodiment of the present invention, like the first sequence, at first the wafer 2 is carried from a load lock chamber into the reaction chamber 1 and is loaded onto the cathode electrode 3. Then, the reaction gas is introduced into the reaction chamber 1 at the predetermined flow rate via the gas introducing ports 10. A set flow rate of the mass flow controller in starting the gas introduction is 100 sccm as the predetermined flow rate. Then, the interior of the reaction chamber 1 is maintained at the predetermined pressure by adjusting the opening of the variable valve 5 serving as the pressure adjusting mechanism. Then, the generation of the plasma 7 is started by supplying the HF power to the cathode electrode 3 arranged in the reaction chamber 1. Then, the predetermined wafer process is applied to the wafer 2 which is placed on the cathode electrode 3 in the reaction chamber 1. Then, after the predetermined wafer process is completed, the supply of the HF power is stopped and also the generation of the plasma 7 in the reaction chamber 1 is stopped. According to the sixth sequence, the gas flow is generated on the wafer in parallel with the wafer immediately before the generation of the plasma 7 is started and when the generation of the plasma 7 is stopped.

Figure 7:
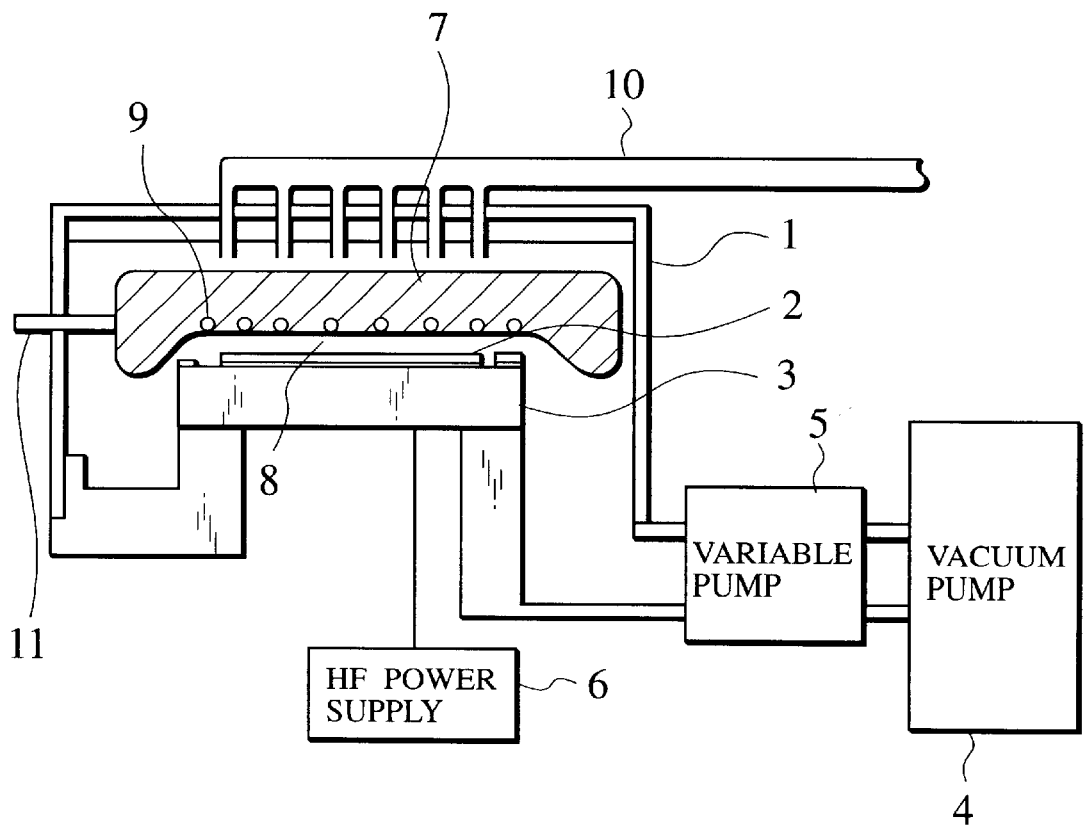
FIG. 7 is a sectional view showing a configuration of the plasma processing equipment in connection with the sixth sequence.

FIG. 7 shows a configuration of the plasma processing equipment in connection with the sixth sequence. As shown in FIG. 7, in addition to the configuration of the plasma processing equipment shown in FIG. 1, this plasma processing equipment further comprises side surface gas introducing ports 11 provided on a side surface of the reaction chamber 1 at symmetrical positions. If the gas is introduced through the side surface gas introducing ports 11 only when the generation of the plasma 7 is stopped and immediately before the generation of the plasma 7 is started, the gas flow can be generated on the wafer in parallel with the wafer. In this case, the same gas seed as the reaction gas introduced via the gas introducing ports 10 may be introduced as the seed of the introduced gas, otherwise the gas seed such as the inert gas that is different from the reaction gas may be introduced. Furthermore, as shown in FIG. 7, it is desired that the exhaust ports through which the variable valve 5 is arranged should be positioned at the end against which the flow of the gas introduced via the side surface gas introducing ports 11 is bumped. In other words, it is desired that the side surface gas introducing ports 11 should be arranged such that the flow of the gas can be directed to the exhaust port.

According to the sixth sequence, the particles 9 being dropped on the wafer 2 before the generation of the plasma 7 is started can be blown away by the gas flow that is generated on the wafer in parallel with the wafer, and be removed. Also, the particles 9 floating over the sheath 8 when the generation of the plasma 7 is stopped can be removed since they are carried on the gas flow.

<Experimental Results>

Experimental results of the plasma etching process of the substrate performed in compliance with the first to fourth sequences of the present invention and the sequence in the prior art will be explained hereunder.

Figure 8:
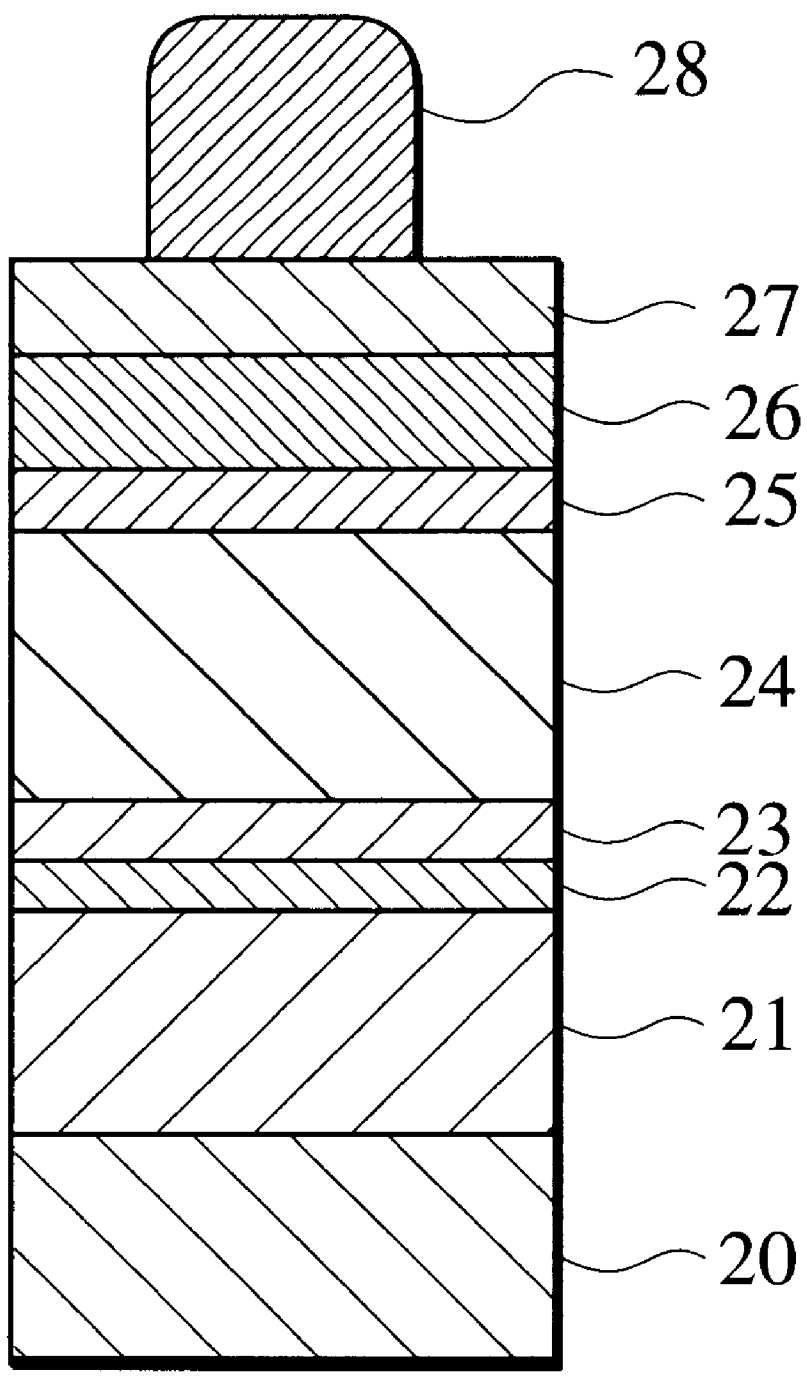
FIG. 8 is a sectional view showing a structure of a processed substrate according to the embodiment of the present invention.

FIG. 8 is a sectional view showing a structure of the processed substrate. A silicon oxide film 21 of 1 μm film thickness is deposited on a silicon substrate 20, and then a barrier metal consisting of a titanium (Ti) film 22 of 20 nm film thickness and a titanium nitride (TiN) film 23 of 70 nm film thickness is deposited on the silicon oxide film 21. Then, a wiring film 24 containing aluminum as a main component and containing 0.5% copper (Cu) is deposited, and then a titanium (Ti) film 25 of 20 nm film thickness and a TiN film 26 of 60 nm film thickness are deposited on the wiring film 24 as a reflection preventing film. Further, an organic reflection preventing film 27 is deposited, and then a resist pattern 28, that is exposed/developed by the normal lithography technology to be deposited selectively and has a line and space of 0.20 μm width, is formed on the reflection preventing film 27.

According to the present experiments, first the plasma etching process of the Al wirings (22 to 26) is carried out after the organic reflection preventing film 27 is deposited. Then, the resist 28 is removed and the postprocessing is conducted. Then, the defect test for checking the number of defects in the Al wiring pattern is carried out by using the defect testing equipment, and then the short-circuit test of the wiring is carried out by the electrical measurement. The defect test corresponds to the test for detecting foreign substances, deformed profiles, etc. in the repetition of regular patterns after a plurality of same patterns are formed on the wafer. Normally, the foreign substances, the deformed profiles, etc. are caused by pattern deformation, dust, and others.

The experimental results are given in FIG. 9. The number of defect indicates the number of patterns pointed out as NG patterns in the defect test. Also, the short-circuit test result indicates the yield. As shown in FIG. 9, in compliance with the first to fourth sequences, the number of defects due to the particles is small rather than the sequence in the prior art, and also good results can be derived by the short-circuit test.

With the above, the dry etching process has been explained as an example as the embodiment of the invention. However, it can be easily guessed that the similar effects can be achieved by the plasma processing equipment by which the processed substrate is arranged on the electrode, then the process gas is introduced into the process chamber, and then the plasma is generated by applying the HF power to process the substrate, e.g., the sputter equipment, the plasma CVD equipment, etc. In addition, the plasma generating method is applicable to all types such as the parallel plate type, the inductive coupling type, the electron cyclotron resonance type, etc.

What is claimed is:

1. A semiconductor device manufacturing method comprising:
   loading a processed substrate in a reaction chamber;
   introducing a reaction gas into the reaction chamber at a flow rate so that a plasma generation process is performed;
   maintaining an interior of the reaction chamber at a pressure so that the plasma generation process is performed;
   starting generation of plasma by supplying a high frequency power to an electrode arranged in the reaction chamber;
   applying the plasma generation process to the processed substrate; and
   stopping generation of the plasma by stopping supply of the high frequency power while introducing continuously a gas at the flow rate after the plasma generation process is completed.

2. A semiconductor device manufacturing method according to claim 1, wherein, in stopping generation of the plasma by stopping supply of the high frequency power, the flow rate of the gas introduced continuously is larger than the flow rate at which the plasma generation process is performed.

3. A semiconductor device manufacturing method according to claim 1, wherein, in stopping generation of the plasma by stopping supply of the high frequency power, a pressure in the reaction chamber is lower than the pressure at which the plasma generation process is performed.

4. A semiconductor device manufacturing method comprising:
   loading a processed substrate in a reaction chamber;
   introducing a reaction gas into the reaction chamber at a flow rate so that a plasma generation process is performed, by increasing a flow rate at a speed of less than 50 sccm/second;
   maintaining an interior of the reaction chamber at a pressure so that the plasma generation process is performed;
   starting generation of plasma by supplying a high frequency power to an electrode arranged in the reaction chamber;
   applying the plasma generation process to the processed substrate; and
   stopping generation of the plasma by stopping supply of the high frequency power after the plasma generation process is completed.

5. A semiconductor device manufacturing method comprising:
   loading a processed substrate in a reaction chamber;
   introducing a reaction gas into the reaction chamber at a flow rate so that a plasma generation process is performed;
   maintaining an interior of the reaction chamber at a pressure so that the plasma generation process is performed;
   starting generation of plasma by supplying a high frequency power to an electrode arranged in the reaction chamber;
   applying the plasma generation process to the processed substrate; and
   stopping generation of the plasma by stopping supply of the high frequency power after the plasma generation process is completed;
   wherein a pressure in the reaction chamber is set lower than the pressure at which the plasma generation process is performed, before introduction of the reaction gas into the reaction chamber is started.

6. A semiconductor device manufacturing method comprising:
   loading a processed substrate in a reaction chamber;
   introducing a reaction gas into the reaction chamber at a flow rate so that a plasma generation process is performed;
   maintaining an interior of the reaction chamber at a pressure so that the plasma generation process is performed;
   starting generation of plasma by supplying a high frequency power to an electrode arranged in the reaction chamber;
   applying the plasma generation process to the processed substrate; and
   stopping generation of the plasma by stopping supply of the high frequency power after the plasma generation process is completed;
   wherein, in starting generation of plasma by supplying the high frequency power to the electrode arranged in the reaction chamber, a flow of a gas which is in parallel with the processed substrate and is directed to an exhausting means side is formed on the processed substrate.

7. A semiconductor device manufacturing method comprising:

loading a processed substrate in a reaction chamber;

introducing a reaction gas into the reaction chamber at a flow rate so that a plasma generation process is performed;

maintaining an interior of the reaction chamber at a pressure so that the plasma generation process is performed;

starting generation of plasma by supplying a high frequency power to an electrode arranged in the reaction chamber;

applying the plasma generation process to the processed substrate; and stopping generation of the plasma by stopping supply of the high frequency power after the plasma generation process is completed;

wherein, in stopping generation of the plasma by stopping supply of the high frequency power, a flow of a gas which is in parallel with the processed substrate and is directed to an exhausting means side is formed on the processed substrate.

* * * * *